(12) United States Patent
Ditzel et al.

(10) Patent No.: US 10,176,420 B2
(45) Date of Patent: Jan. 8, 2019

(54) STRIP-TYPE SUBSTRATE FOR PRODUCING CHIP CARD MODULES

(71) Applicant: HERAEUS DEUTSCHLAND GMBH & CO. KG, Hanau (DE)

(72) Inventors: Eckhard Ditzel, Linsengericht (DE); Bernd Gehlert, Bruchköbel (DE); Frank Krüger, Nidderau (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 2 days.

(21) Appl. No.: 15/552,300

(22) PCT Filed: Feb. 17, 2016

(86) PCT No.: PCT/EP2016/053358
§ 371 (c)(1),
(2) Date: Aug. 21, 2017

(87) PCT Pub. No.: WO2016/131870
PCT Pub. Date: Aug. 25, 2016

(65) Prior Publication Data
US 2018/0039875 A1    Feb. 8, 2018

(30) Foreign Application Priority Data
Feb. 20, 2015   (DE) .................. 10 2015 102 453

(51) Int. Cl.
*C25D 3/12*    (2006.01)
*C25D 3/46*    (2006.01)
(Continued)

(52) U.S. Cl.
CPC ......... *G06K 19/07722* (2013.01); *C25D 3/12* (2013.01); *C25D 3/46* (2013.01);
(Continued)

(58) Field of Classification Search
CPC ............. G06K 19/07788; G06K 7/081; G06K 19/067; G06K 7/08; G06K 19/07722;
(Continued)

(56) References Cited

U.S. PATENT DOCUMENTS

| | | |
|---|---|---|
| 4,961,105 A | 10/1990 | Yamamoto |
| 5,740,606 A | 4/1998 | Rose |

(Continued)

FOREIGN PATENT DOCUMENTS

| | | |
|---|---|---|
| CN | 104218009 A | 6/2013 |
| CN | 104332463 A | 2/2015 |

(Continued)

OTHER PUBLICATIONS

Written Opinion dated Aug. 25, 2016 in application PCT/EP2016/05338 in German.
(Continued)

*Primary Examiner* — Sonji N Johnson
(74) *Attorney, Agent, or Firm* — Hassan Abbas Shakir; Shakir Law PLLC

(57) ABSTRACT

A strip-type substrate includes a foil having a number of substrate units for producing chip card modules. The substrate has an inner face for at least partial direct or indirect contacting of a semiconductor chip and an outer face lying opposite the inner face. The foil includes of steel, in particular high-grade steel, and a first layer of nickel or a nickel alloy on at least some sections of the outer face.

16 Claims, 3 Drawing Sheets

(51) Int. Cl.
  *G06K 19/077* (2006.01)
  *C25D 5/12* (2006.01)
  *H01L 23/00* (2006.01)
  *H01L 23/498* (2006.01)
  *C25D 7/06* (2006.01)
  *C25D 3/56* (2006.01)
  *H01L 21/48* (2006.01)
  *H01L 23/495* (2006.01)

(52) U.S. Cl.
  CPC .............. *C25D 3/562* (2013.01); *C25D 5/12* (2013.01); *C25D 7/0614* (2013.01); *G06K 19/07743* (2013.01); *H01L 21/4821* (2013.01); *H01L 23/49534* (2013.01); *H01L 23/49565* (2013.01); *H01L 23/49582* (2013.01); *H01L 23/49855* (2013.01); *H01L 24/97* (2013.01); *H01L 24/08* (2013.01); *H01L 24/48* (2013.01); *H01L 24/80* (2013.01); *H01L 24/85* (2013.01); *H01L 2224/08225* (2013.01); *H01L 2224/48227* (2013.01); *H01L 2224/73251* (2013.01); *H01L 2224/80439* (2013.01); *H01L 2224/80455* (2013.01); *H01L 2224/80904* (2013.01); *H01L 2224/85439* (2013.01); *H01L 2224/85455* (2013.01); *H01L 2224/97* (2013.01); *H01L 2924/00014* (2013.01)

(58) Field of Classification Search
  CPC ............ G06K 19/07743; H04B 5/0012; H01L 2224/48227; H01L 2224/80439; H01L 23/49534; H01L 23/49565; H01L 21/4821; H01L 23/49582; H01L 23/49855; H01L 24/97; H01L 2224/80904; H01L 2224/85455; H01L 2224/08225; H01L 24/85; H01L 24/80; H01L 24/48; H01L 24/08; H01L 2224/80455; H01L 2224/97; H01L 2924/00014; H01L 2224/73251; H01L 2224/85439; C25D 3/12; C25D 3/46; C25D 3/562; C25D 7/0614; C25D 5/12
  See application file for complete search history.

(56) References Cited

U.S. PATENT DOCUMENTS

| | | | |
|---|---|---|---|
| 7,135,782 B2 | 11/2006 | Nishikawa | |
| 8,884,420 B1 | 11/2014 | Hosseini et al. | |
| 9,666,501 B2* | 5/2017 | Haga | H01L 23/3121 |
| 2004/0069060 A1 | 4/2004 | Bogdanov | |
| 2009/0085232 A1 | 4/2009 | Hoo et al. | |
| 2010/0224402 A1 | 9/2010 | Lim et al. | |
| 2014/0353387 A1* | 12/2014 | Hoegerl | G06K 19/07728 235/492 |
| 2014/0353822 A1 | 12/2014 | Oyachi et al. | |
| 2017/0133313 A1 | 5/2017 | Ditzel | |

FOREIGN PATENT DOCUMENTS

| | | |
|---|---|---|
| DE | 19618103 A1 | 11/1997 |
| DE | 10 2013 105 729 A1 | 12/2014 |
| DE | 10 2014 109 771 A1 | 1/2015 |
| JP | 2000251043 A | 9/2000 |
| TW | 200301871 A | 7/2003 |
| TW | 565916 | 12/2003 |
| TW | 201108930 A | 3/2011 |
| TW | 201338115 A | 9/2013 |
| TW | 201415966 A | 4/2014 |
| TW | 201445690 A | 12/2014 |
| WO | 2015197386 A1 | 12/2015 |

OTHER PUBLICATIONS

International Search Report dated May 18, 2016 in application PCT/EP2016/05338 in German. translation provided.
International Preliminary Report on Patentability (IPRP) issued in patent application PCT/EP2016/053358 dated Aug. 22, 2017 by the International Bureau of WIPO in German, official English translation provided, all references discussed therein have been previously cited.
Search Report issued in Taiwanese patent application 105104956 dated Sep. 30, 2017 by the Taiwan Intellectual Property Office.
Search Report issued in Taiwanese patent application 105104956 dated Mar. 2, 2017 by the Taiwan Intellectual Property Office.

* cited by examiner

STRIP-TYPE SUBSTRATE FOR PRODUCING CHIP CARD MODULES

BACKGROUND OF THE INVENTION

1. Field of the Invention

The invention relates to a strip-type substrate comprising a foil having a plurality of substrate units for producing chip card modules. More particularly, the invention is directed to a chip card module, an electronic device comprising such a chip card module, and a method for producing a substrate.

2. Discussion of the Related Art

It is known from the prior art to insert the chip card modules produced from a strip-type substrate in cutouts of plastic cards. The most essential part for the functioning of a chip card is the integrated circuit, which determines the mode of operation and thus the field of application of the chip card.

A semiconductor chip is part of a so-called chip card module serving, inter alia, to protect the semiconductor chip. The chip card module furthermore establishes the communication connection between the semiconductor chip and a reader. Typical strip-type substrates for producing chip card modules are based on copper, wherein these substrates are correspondingly nickel-plated and subsequently gold-plated. On account of the high price of gold, however, this coating involves a very cost-intensive form of a strip-type substrate.

Typical requirements made of strip-type substrates or of the resultant metallizations of chip card modules are firstly the requirement for relatively low contact resistances. The contact resistances must be constant over the entire length of the strip-type substrate and across different production batches. The contact resistance often changes, however, especially after heat treatment steps during the production of chip cards. For example on account of Cr oxide formations. Heat treatment steps are typically necessary during the lamination of the strips with a plastic. Since chip cards are flat, on the one hand chip card modules must not exceed a maximum total thickness. On the other hand, the chip card modules must have a sufficient stability to prevent damage to the chip or the chip card module from occurring, as a result of which the function of the chip card can be impaired.

SUMMARY OF THE INVENTION

The invention is based on the object of specifying a strip-type substrate for producing chip card modules which firstly may be produced cost-effectively with regard to the materials to be used and secondly enables a small total thickness of the electrical devices produced from the chip card modules. Furthermore, the strip-type substrate is intended to be developed further in such a way that it is possible to realize a constant low electrical contact resistance on the outer contact side of the chip card module. Furthermore, the invention is based on the object of specifying a chip card module, an electronic device, in particular a chip card, comprising such a chip card module, and also a method for producing a substrate.

The invention is based on the concept of specifying a strip-type substrate comprising a foil having a plurality of substrate units for producing chip card modules. The substrate has an inner side for direct or indirect contacting with a semiconductor chip at least in sections, and an outer side formed opposite the inner side.

According to the invention, the foil is formed from a steel, in particular high-grade steel, wherein a first layer composed of nickel or composed of a nickel alloy is formed at least in sections on the outer side of the strip-type substrate.

That surface of a chip card module which is actually visible and comes into contact with a card reader may accordingly be protected with a cost-effective coating. Nickel and nickel alloys have a sufficiently low contact resistance, which remains sufficiently stable over the course of the manufacturing process. Accordingly, it is possible to functionalize the outer side of a chip card module in such a way that the electrical contact resistance may be set such that it is constant across all batches and does not rise in the context of the manufacturing process. The outer side of the chip card module may also be referred to as contact side or contacting side of the chip card module.

Furthermore, nickel is a material available at a relatively reasonable price, such that considerable costs may be saved in comparison with gold coatings.

The foil thickness of the substrate according to the invention is reduced in comparison with thicknesses of known foils based on copper materials, without the stability of the chip card modules produced from the substrate being impaired in the process.

Preferably, the thickness of the foil composed of steel, in particular high-grade steel, is 15 μm to 35 μm. In one particularly preferred embodiment, the foil thickness is approximately 20 μm. Using the chip card modules produced from the strip-type substrate, the total thickness of the chip card module may be reduced to approximately 200 μm.

In one particularly preferred embodiment of the invention, the foil is formed from an austenitic high-grade steel. In contrast to the copper alloys usually used in the prior art, steel or high-grade steel at very high strengths still has a sufficient forming capability. The steel used is preferably hard-rolled austenitic high-grade steel. The term high-grade steel is understood to mean in accordance with EN 10020 alloyed or unalloyed steels having a particular degree of purity, e.g. steels having a sulfur and phosphorus content of a maximum of 0.025%. The austenitic microstructure leads to a rust- and acid-resistant steel, for example in accordance with DIN 267 part 11. Such a high-grade steel has the advantage of a high strength in conjunction with good forming capability.

The inner side of the strip-type substrate denotes that side of the substrate whose individual substrate unit sides serve for direct or indirect contacting with a semiconductor chip in association with the chip card module to be produced.

The outer side of the strip-type substrate defines that side of the substrate which firstly is formed opposite the inner side and secondly serves for contacting with a reader, such as e.g. an automatic teller machine. The outer side of the strip-type substrate is often also referred to as metallization of the chip card module. By virtue of forming a first layer composed of nickel or a nickel alloy on the outer side of the strip-type substrate, the contacting with a reader actually takes place on the thin first layer.

A second layer composed of nickel or a nickel alloy may be formed at least in sections on the inner side of the strip-type substrate. In one particularly preferred embodiment of the invention, the strip-type substrate is completely coated with nickel or a nickel alloy.

In a further embodiment of the invention, it may be provided that a third layer composed of silver or a silver alloy is formed at least in sections on the second layer composed of nickel or a nickel alloy. The additional silver or silver alloy layer or the abovementioned third layer serves for the improved contacting of the chip card module to be produced with the semiconductor chip. Preferably, the third layer is also formed in a relatively thin fashion. The third layer may have a layer thickness of 0.1 to 5.0 µm, in particular of 0.5 to 3.0 µm, in particular of 1.0 to 2.0 µm. The direct or indirect contacting of the substrate with a semiconductor chip accordingly takes place for example on said third layer composed of silver or a silver alloy.

The nickel alloy described may be a nickel-palladium alloy (NiPd) having a palladium proportion of 0.1 to 30.0%, in particular of 5.0 to 25.0%, in particular of 10.0 to 20.0%. The proposed nickel layer or nickel alloy layer protects the strip-type substrate on the outer side and optionally on the inner side. Such materials have a relatively low electrical contact resistance that is maintained sufficiently stably over the course of the manufacturing process.

The first layer and/or the second layer may have a layer thickness of 0.1 to 5.0 µm, in particular of 0.5 to 3.0 µm, in particular of 1.0 to 2.0 µm. The first layer and/or the second layer thus have/has such a small layer thickness that the total thickness of the chip card module to be produced is not further affected adversely.

The invention furthermore relates to a chip card module comprising a substrate unit having an inner side and an outer side formed opposite the inner side, wherein a semiconductor chip is directly or indirectly contacted with the inner side of the substrate unit.

According to the invention, the substrate unit is formed from steel, in particular high-grade steel, wherein a first layer composed of nickel or a nickel alloy is formed at least in sections on the outer side of the substrate unit. The substrate unit is a singulated substrate unit from the above-described strip-type substrate comprising a foil.

The explanations and/or embodiments indicated below are accordingly evident from the explanations and/or embodiments already mentioned in association with the strip-type substrate. The inner side of the substrate unit should be understood to mean the side which serves for direct or indirect contacting with the semiconductor chip of a chip card module. The outer side should then be understood to mean the metallization of the chip card module or that side of the chip card module which serves for contacting with a reader.

A second layer composed of nickel or a nickel alloy may be formed at least in sections on the inner side of the substrate unit. Accordingly, it is possible for the substrate unit to be completely surrounded or coated with a layer composed of nickel or a nickel alloy. The nickel alloy may be a nickel-palladium alloy (NiPd) having a palladium proportion of 0.1 to 30.0%, in particular of 5.0 to 25.0%, in particular of 10.0 to 20.0%.

The first layer composed of nickel or a nickel alloy and/or the second layer composed of nickel or a nickel alloy may have a layer thickness of 0.1 to 5.0 µm, in particular of 0.5 to 3.0 µm, in particular of 1.0 to 2.0 µm.

A third layer composed of silver or a silver alloy may be formed at least in sections on the second layer formed on the inner side of the substrate unit. Such a further third layer on the inner side of the substrate unit serves for the improved contacting of the chip card module or of the substrate unit with a semiconductor chip. The third layer may have a layer thickness of 0.1 to 5.0 µm, in particular of 0.5 to 3.0 µm, in particular of 1.0 to 2.0 µm.

To summarize, it may be stated that the chip card module according to the invention is based on the same concepts as the substrate according to the invention, namely on a layer composed of nickel or a nickel alloy being formed at least in sections on a foil composed of steel, in particular high-grade steel, in particular on the outer side of the foil.

The invention furthermore encompasses an electronic device, in particular a chip card, a health card, a bank card, a ticket, a ticket for public transport, a hotel card, an identity card, a passport, a paper-sheet-like card, such as an entrance card, comprising a chip card module according to the invention.

The invention furthermore encompasses a dual interface card comprising a chip card module according to the invention. Dual interface cards comprise two interfaces, namely an interface exhibiting contacts and a contactless, such as e.g. RFID, interface. Transponder cards, such as Mifare or Legic cards, for example, are furthermore known in the case of contactless chip cards.

In the context of the method according to the invention for producing a strip-type substrate having a plurality of substrate units for further processing for manufacturing chip card modules, in a first step, structures of the substrate units are introduced into a foil composed of a steel, in particular high-grade steel. The foil is subsequently coated with nickel or a nickel alloy at least in sections. Preferably, both sides of the flat, strip-type substrate are provided or coated with nickel or a nickel alloy.

In a further embodiment of the method according to the invention it is provided that the foil coated with nickel or a nickel alloy is coated at least in sections with silver at least in sections on one side, in particular on an inner side for direct or indirect contacting with a semiconductor chip.

BRIEF DESCRIPTION OF THE DRAWINGS

The invention is explained more specifically below with further details on the basis of exemplary embodiments with reference to the enclosed schematic drawings.

In said drawings.

DETAILED DESCRIPTION OF THE INVENTION

Figure 1A:
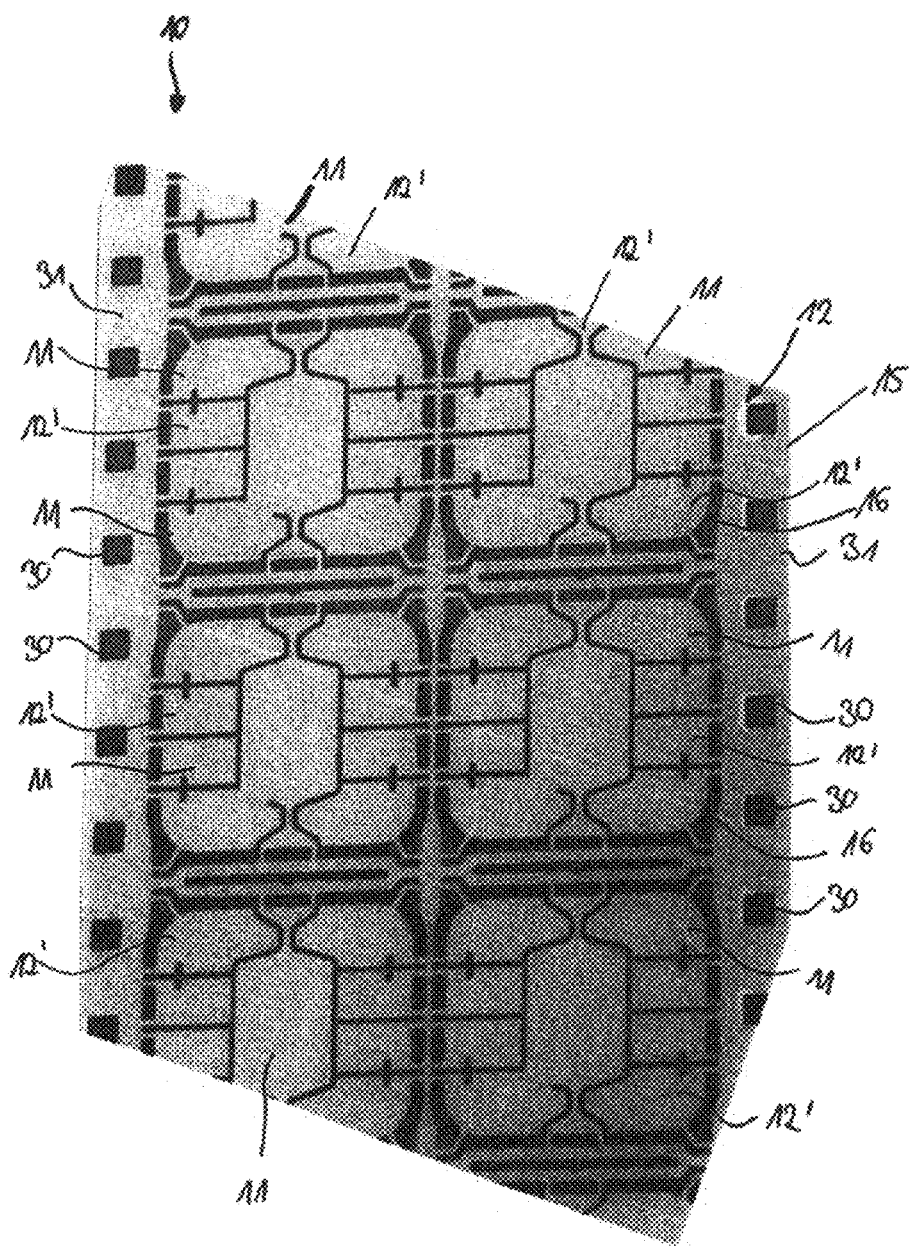
FIG. 1a shows a strip-type substrate having a plurality of substrate units for producing chip card modules, wherein the outer side is visible in this view.

The basic structure of the strip-type substrate 10 as illustrated in FIG. 1 may be realized in the context of the invention. However, the invention is not restricted to the basic structure illustrated in FIG. 1a, in particular the structuring of the strip-type substrate 10. The invention also encompasses substrates that are structured with other geometries.

Figure 1B:
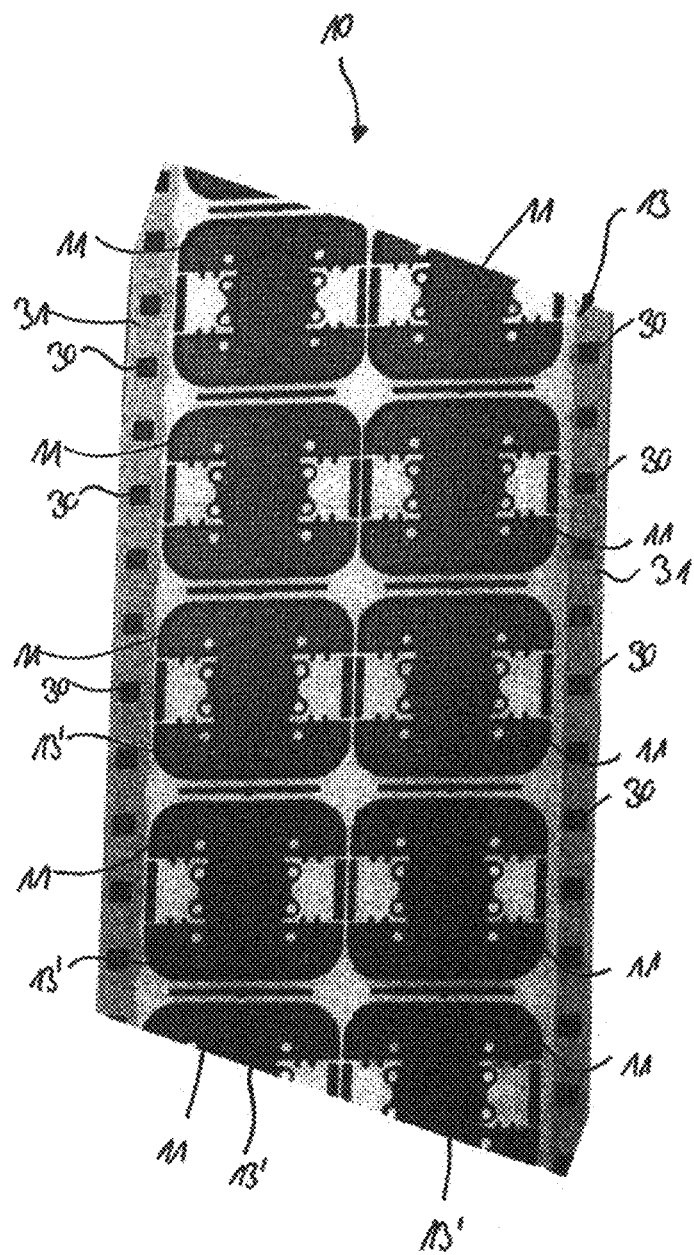
FIG. 1b shows the strip-type substrate in accordance with FIG. 1a with a view of the inner side.

The strip-type substrate 10 in accordance with FIGS. 1a and 1b is a preliminary product that is processed further to form a package or a chip card module. The illustrated structures in FIGS. 1a and 1b are also present in the further processed chip card module or in the end product, for example a chip card or generally in an electronic device.

Specifically, the strip-type substrate 10 in accordance with FIG. 1a is constructed as follows. The strip-type substrate 10 is produced from a flexible foil 15. The flexible foil 15 is formed from hard-rolled austenitic high-grade steel. The foil 15 has a plurality of substrate units 11, which are singulated for producing chip card modules in a later method step.

The substrate units 11 are constructed identically in each case. The illustration in accordance with FIG. 1*a* involves a view of the outer side 12 of the strip-type substrate 10. The outer side 12 is formed opposite the inner side 13 (visible in FIG. 1*b*) of the strip-type substrate 10. The outer side 12 of the strip-type substrate 10 denotes that side of the strip-type substrate 10 on whose side the outer sides 12' of the substrate units 11 are formed. The outer sides 12' of the respective substrate units 11 are the contact areas or metallization areas of chip card modules. These are known as gold- to copper-like elements in standard chip cards.

Structures 16 of the substrate units 11 are discernible on the outer side 12 of the strip-type substrate 10. The individual contact areas of the substrate units 11 are formed with the aid of the structures 16.

FIG. 1*b* illustrates the inner side 13 of the strip-type substrate 10. The individual substrate units 11 are discernible in this case, too. The inner side 13 of the strip-type substrate 10 denotes that side of the strip-type substrate 10 on which the inner sides 13' of the individual substrate units 11 are formed. Semiconductor chips (not illustrated) are contacted directly or indirectly on the inner sides 13' of the respective substrate units 11. Contacting may be effected with the aid of bond wires.

The foil used in association with the exemplary embodiments is a metal foil composed of a hard-rolled, austenitic high-grade steel. The thickness of the foil is 15 μm to 35 μm, specifically approximately 20 μm. As a result, the total thickness of the package or of the chip card module may be reduced down to 200 μm.

Figure 2:
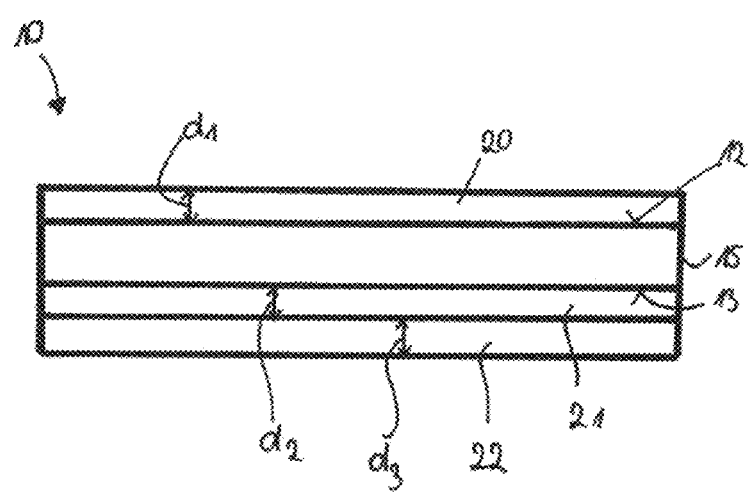
FIG. 2 shows a schematic section through the strip-type substrate in accordance with FIGS. 1a and 1b.

FIG. 2 illustrates a schematic sectional illustration through the strip-type substrate 10. The substrate 10 comprises the inner side 13 for direct or indirect contacting with a semiconductor chip at least in sections, and the outer side 12, which is formed opposite the inner side 13 and parallel thereto in the example illustrated.

A first layer 20 composed of nickel or a nickel alloy is formed at least in sections on the outer side 12.

A second layer 21 composed of nickel or a nickel alloy is formed at least in sections on the illustrated inner side 13 as well.

The nickel alloy may be for example a nickel-palladium alloy (NiPd) having a palladium proportion of 10.0 to 20.0%.

In other words, the foil 15 is provided with a nickel or nickel alloy coating on the entire surface. The first layer 20 and the second layer 21 each have a layer thickness $d_1$ and $d_2$, respectively, of 1.0 to 2.0 μm.

A third layer 22 composed of silver or a silver alloy may be formed at least in sections on the second layer 21. In other words, the third layer 22 involves that side of the substrate unit 11 which faces the semiconductor chip (not illustrated). The third layer 22 has a layer thickness $d_3$ of 1.0 to 2.0 μm.

As is evident in FIG. 1*b*, in particular, the third layer 22 is not applied completely on the inner side 13 of the strip-type substrate 10. In particular the conveying strips 31 having the conveying openings 30 are not provided with the third layer 22. It is thus possible to save silver material or silver alloy material.

In the case of the chip card module according to the invention, a semiconductor chip is connected to a substrate unit 11 of the strip-type substrate 10. For this purpose, the semiconductor chip may be embedded in a potting compound.

The production of a chip card module using the strip-type substrate 10 in accordance with FIGS. 1*a* and 1*b* is carried out as follows: firstly, a semiconductor chip is applied on an inner side 13' of a substrate unit 11 and is directly or indirectly connected to the inner side 13'. In particular, the direct or indirect contacting is effected on the thin third layer 22 composed of silver or a silver alloy. By way of example, this may be carried out with the aid of bond wires. Afterward, the semiconductor chip and the bond wires are fixed by the application of a molding compound or potting compound, for example an epoxy resin. After the potting compound has been cured, it is fixedly connected to the respective substrate unit 11.

Afterward, the structure may be electronically stamped free. Afterward, a functional test is carried out in order to be able to sort out defective modules. The chip card modules are then separated from the foil 15 for example by the removal of webs between the individual substrate units 11. The chip card modules thus produced may subsequently be installed.

In the method for producing a strip-type substrate 10 having a plurality of substrate units 11 for further processing for manufacturing chip card modules, the foil 15 on high-grade steel is firstly provided with the structures 16 of the substrate units 11. The foil 15 is subsequently coated electrolytically with the first layer 20 and the second layer 21 composed of nickel or a nickel alloy.

The foil 15 coated with nickel or a nickel alloy is subsequently coated with a third layer 22 composed of silver or a silver alloy at least in sections on the inner side 13.

The substrate units 11 described or the chip card modules producible with the aid of the substrate units are particularly suitable for electronic devices such as chip cards. In particular, reference is made to dual interface cards in this context.

LIST OF REFERENCE SIGNS

10 strip-type substrate
11 substrate unit
12 outer side of substrate
12' outer side of substrate unit
13 inner side of substrate
13' inner side of substrate unit
15 foil
16 structure
20 first layer
21 second layer
22 third layer
30 conveying opening
31 conveying strip
$d_1$ thickness of first layer
$d_2$ thickness of second layer
$d_3$ thickness of third layer

What is claimed is:
1. A strip-type substrate comprising:
    a foil comprising a plurality of substrate units, each substrate unit for producing a chip card module;
    an inner side for direct or indirect contact with a semiconductor chip at least in sections;
    an outer side formed opposite the inner side; and
    a first layer formed on the outer side, the first layer comprising, at least in sections, nickel or a nickel alloy;
    wherein the foil is formed from austenitic high-grade steel;
    wherein the foil comprises a thickness of 15 μm to 35 μm.
2. The substrate as claimed in claim 1, further comprising a second layer formed on the inner side, the second layer comprising, at least in sections, nickel or the nickel alloy.

3. The substrate as claimed in claim 2, wherein the first layer or the second layer has a layer thickness selected from the group of 0.1-5.0 µm, 0.5-3.0 µm, or 1.0-2.0 µm.

4. The substrate as claimed in claim 2,
further comprising a third layer formed, at least in sections, on the second layer;
wherein the third layer comprises silver or a silver alloy.

5. The substrate as claimed in claim 4, wherein the third layer has a layer thickness selected from the group of 0.1-5.0 µm, 0.5-3.0 µm, or 1.0-2.0 µm.

6. The substrate as claimed in claim 1, wherein the nickel alloy is a nickel-palladium alloy (NiPd) having a palladium proportion selected from the group of 0.1-30.0%, 5.0-25.0%, or 10.0-20.0%.

7. A chip card module comprising:
a substrate unit comprising
a foil comprising a plurality of substrate units, each substrate unit for producing a chip card module;
an inner side for direct or indirect contact with a semiconductor chip at least in sections;
an outer side formed opposite the inner side; and
a first layer formed on the outer side, the first layer comprising, at least in sections, nickel or a nickel alloy;
wherein the foil is formed from austenitic high-grade steel;
wherein the foil comprises a thickness of 15 µm to 35 µm.

8. The chip card module as claimed in claim 7, further comprising a second layer formed on the inner side, the second layer comprising, at least in sections, nickel or the nickel alloy.

9. The chip card module as claimed in claim 8, wherein the nickel alloy is a nickel-palladium alloy (NiPd) having a palladium proportion selected from the group of 0.1-30.0%, 5.0-25.0%, or 10.0-20.0%.

10. The chip card module as claimed in claim 8, wherein the first layer or the second layer has a layer thickness selected from the group of 0.1-5.0 µm, 0.5-3.0 µm, or 1.0-2.0 µm.

11. The chip card module as claimed in claim 8,
further comprising a third layer formed, at least in sections, on the second layer;
wherein the third layer comprises silver or a silver alloy.

12. The chip card module as claimed in claim 11, wherein the third layer has a layer thickness selected from the group of 0.1-5.0 µm, 0.5-3.0 µm, or 1.0-2.0 µm.

13. An electronic device selected from the group of a chip card, a health card, a bank card, a ticket for public transport, a hotel card, an identity card, a passport, a paper-sheet-like card, an entrance card, the electronic card comprising:
a chip card module as claimed in claim 7.

14. A dual interface card comprising:
a chip card module as claimed in claim 7.

15. A method for producing a strip-type substrate,
the strip-type substrate comprising
a foil comprising a plurality of substrate units, each substrate unit for producing a chip card module;
an inner side for direct or indirect contact with a semiconductor chip at least in sections;
an outer side formed opposite the inner side; and
a first layer formed on the outer side, the first layer comprising, at least in sections, nickel or a nickel alloy;
wherein the foil is formed from austenitic high-grade steel;
wherein the foil comprises a thickness of 15 µm to 35 µm;
the method comprising the steps of:
introducing structures of the substrate units into the foil;
coating electrolytically the foil with the nickel or nickel alloy to form the first layer,
wherein the coating is performed by completely coating the foil.

16. The method as claimed in claim 15, wherein the foil coated with nickel or a nickel alloy is coated at least in sections with silver or a silver alloy at least in sections on one side an inner side for direct or indirect contact with a semiconductor chip.

* * * * *